United States Patent
Hu

(10) Patent No.: US 12,219,860 B2
(45) Date of Patent: Feb. 4, 2025

(54) DISPLAY DEVICE HAVING HEAT DISSIPATION CAPSULES AND DISPLAY TERMINAL HAVING HEAT DISSIPATION CAPSULES

(71) Applicant: WUHAN CHINA STAR OPTOELECTRONICS SEMICONDUCTOR DISPLAY TECHNOLOGY CO., LTD., Hubei (CN)

(72) Inventor: Yang Hu, Hubei (CN)

(73) Assignee: WUHAN CHINA STAR OPTOELECTRONICS SEMICONDUCTOR DISPLAY TECHNOLOGY CO., LTD., Hubei (CN)

( * ) Notice: Subject to any disclaimer, the term of this patent is extended or adjusted under 35 U.S.C. 154(b) by 550 days.

(21) Appl. No.: 17/617,303

(22) PCT Filed: Nov. 25, 2021

(86) PCT No.: PCT/CN2021/133150
§ 371 (c)(1),
(2) Date: Dec. 7, 2021

(87) PCT Pub. No.: WO2023/056692
PCT Pub. Date: Apr. 13, 2023

(65) Prior Publication Data
US 2023/0354682 A1 Nov. 2, 2023

(30) Foreign Application Priority Data
Oct. 9, 2021 (CN) .......................... 202111176245.6

(51) Int. Cl.
*H10K 59/80* (2023.01)
*H04M 1/02* (2006.01)
(Continued)

(52) U.S. Cl.
CPC ...... *H10K 59/8794* (2023.02); *H04M 1/0216* (2013.01); *H05K 7/2099* (2013.01); *H10K 2102/311* (2023.02)

(58) Field of Classification Search
CPC ............ H10K 59/8794; H04M 1/0216; H05K 7/2099
See application file for complete search history.

(56) References Cited

U.S. PATENT DOCUMENTS

2014/0008041 A1   1/2014  In et al.
2017/0062480 A1*  3/2017  Li ....................... H01L 27/1218
(Continued)

FOREIGN PATENT DOCUMENTS

CN   103146355 A   6/2013
CN   105825783 A   8/2016
(Continued)

OTHER PUBLICATIONS

Chinese Office Action in corresponding Chinese Patent Application No. 202111176245.6 dated May 13, 2022, pp. 1-9.
(Continued)

*Primary Examiner* — Michael Jung
(74) *Attorney, Agent, or Firm* — PV IP PC; Wei Te Chung

(57) ABSTRACT

Embodiments of the present application provide a display device and a display terminal. A protective layer is disposed outside the display panel, and a plurality of heat dissipation capsules are dispersedly disposed in the protective layer. The heat dissipation capsules are provided with a phase change material. The phase change material can change the material state thereof and absorb a large amount of heat, thereby cooling the display device and the display terminal, solving
(Continued)

the problem of difficult heat dissipation of the display device and the display terminal, and improving the image display quality.

17 Claims, 5 Drawing Sheets

(51) Int. Cl.
    *H05K 7/20*     (2006.01)
    *H10K 102/00*     (2023.01)

(56) References Cited

U.S. PATENT DOCUMENTS

2018/0042139 A1* 2/2018 Rosales .............. H05K 7/20436
2020/0053909 A1* 2/2020 Stellman .............. H05K 7/2099

FOREIGN PATENT DOCUMENTS

| CN | 107523229 A | 12/2017 |
| CN | 108288632 A | 7/2018 |
| CN | 209044233 U | 6/2019 |
| CN | 111029380 A | 4/2020 |
| CN | 113355054 A | 9/2021 |

OTHER PUBLICATIONS

International Search Report in International application No. PCT/CN2021/133150, mailed on Jun. 30, 2022.
Written Opinion of the International Searching Authority in International application No. PCT/CN2021/133150, mailed on Jun. 30, 2022.

* cited by examiner

DISPLAY DEVICE HAVING HEAT DISSIPATION CAPSULES AND DISPLAY TERMINAL HAVING HEAT DISSIPATION CAPSULES

FIELD OF INVENTION

The present application relates to a display technology field, and particularly to a display device and a display terminal.

BACKGROUND

Various display panels such as organic light-emitting display (OLED) panels have been widely used in people's lives, for example used in display screens of mobile phones and computers. With rapid developments of mobile phone functions, power consumptions of mobile phones are gradually increasing, and demands for heat dissipation are also getting higher and higher. Excessive temperature during the use of mobile phones will also affect the image display of the display panel. Requirements for heat resistance are gradually increasing.

Therefore, it is necessary to propose a technical solution to solve the heat dissipation problem of display devices or display terminals to adapt to a high temperature and heat dissipation problems caused by increases of application functions of display devices or the display terminals, so as to improve image display qualities and user experiences.

SUMMARY OF DISCLOSURE

Embodiments of the present application provide a display device and a display terminal, which can solve problems of difficult heat dissipation of display devices and the display terminal, thereby solving high temperature problems caused by increases of application function of the display devices or the display terminals, and solving image display quality degradation and poor user experience caused by the temperature rising.

An embodiment of the present application provides a display device, comprising:
  a display panel;
  a protective layer disposed outside the display panel;
  a plurality of heat dissipation capsules dispersedly disposed in the protective layer, wherein each of the plurality of heat dissipation capsules comprises a shell and a phase change material disposed in the shell.

Optionally, in some embodiments of the present application, further comprising a thermal conductive layer, and the protective layer comprises a first protective layer, and the first protective layer is disposed between the display panel and the thermal conductive layer, so that the plurality of heat dissipation capsules are dispersedly disposed in the first protective layer.

Optionally, in some embodiments of the present application, the first protective layer comprises foam.

Optionally, in some embodiments of the present application, the display device further comprises a circuit board and a driving chip electrically connected to the display panel; and
  the protective layer comprises a second protective layer, the plurality of heat dissipation capsules are dispersedly disposed in the second protective layer, and the second protective layer is adhered to the circuit board or/and the driving chip.

Optionally, in some embodiments of the present application, the second protective layer is an insulating tape.

Optionally, in some embodiments of the present application, the protective layer comprises a third protective layer, the display panel includes a non-foldable portion, a foldable portion, and a pad portion, and the foldable portion is disposed between the non-foldable portion and the pad portion, after the foldable portion is folded, the pad portion is fixed to a back side of the non-foldable portion through the third protective layer, and the plurality of heat dissipation capsules are dispersedly disposed in the third protective layer.

Optionally, in some embodiments of the present application, the third protective layer is a double-sided tape.

Optionally, in some embodiments of the present application, the protective layer comprises:
  a first protective layer comprises the plurality of heat dissipation capsules dispersedly disposed, the display device further comprises a thermal conductive layer, and the first protective layer is disposed between the display panel and the thermal conductive layer;
  a second protective layer comprises the plurality of heat dissipation capsules dispersedly disposed, the display device further comprises a circuit board and a driving chip electrically connected to the display panel, and the second protective layer is adhered to the circuit board or/and the driving chip; and
  a third protective layer comprises the plurality of the heat dissipation capsules dispersedly disposed, the display panel comprises a non-foldable portion, a foldable portion, and a pad portion, and the foldable portion is disposed between the non-foldable portion and the pad portion, and the pad portion is fixed to a back side of the non-foldable portion through a third protective layer after the foldable portion is folded.

Optionally, in some embodiments of the present application, the first protective layer comprises foam, the second protective layer is an insulating tape, and the third protective layer is a double-sided tape.

Optionally, in some embodiments of the present application, the phase change material comprises an inorganic phase change material.

Optionally, in some embodiments of the present application, the inorganic phase change material comprises at least one of zinc nitrate, sodium thiosulfate, disodium hydrogen phosphate dodecahydrate, calcium chloride hexahydrate, and sodium sulfate.

Optionally, in some embodiments of the present application, the phase change material comprises an organic phase change material.

Optionally, in some embodiments of the present application, the organic phase change material comprises at least one of paraffins, higher fatty acids, polyolefins, and alcohol organic materials.

Optionally, in some embodiments of the present application, the organic phase change material comprises at least one of stearic acid, palmitic acid, myristic acid, slicing paraffin, lauric acid, and acetamide.

Optionally, in some embodiments of the present application, the plurality of heat dissipation capsules further comprise a heat transfer material provided in the shell.

Optionally, in some embodiments of the present application, the heat transfer material comprises at least one of aluminum, copper, or graphite.

An embodiment of the present application provides a display terminal, including a terminal body and a display device, wherein the terminal body and the display device are integrated as one body, and the display device comprises:

a display panel;

a protective layer disposed outside the display panel;

a plurality of heat dissipation capsules dispersedly disposed in the protective layer, wherein each of the plurality of heat dissipation capsules comprises a shell and a phase change material disposed in the shell.

Optionally, in some embodiments of the present application, further comprising a thermal conductive layer, and the protective layer comprises a first protective layer, and the first protective layer is disposed between the display panel and the thermal conductive layer, so that the plurality of heat dissipation capsules are dispersedly disposed in the first protective layer.

Optionally, in some embodiments of the present application, the display device further comprises a circuit board and a driving chip electrically connected to the display panel; and the protective layer comprises a second protective layer, the plurality of heat dissipation capsules are dispersedly disposed in the second protective layer, and the second protective layer is adhered to the circuit board or/and the driving chip.

Optionally, in some embodiments of the present application, the protective layer comprises a third protective layer, the display panel includes a non-foldable portion, a foldable portion, and a pad portion, and the foldable portion is disposed between the non-foldable portion and the pad portion, after the foldable portion is folded, the pad portion is fixed to a back side of the non-foldable portion through the third protective layer, and the plurality of heat dissipation capsules are dispersedly disposed in the third protective layer.

Embodiments of the present application provide a display device and a display terminal. A protective layer is disposed outside the display panel, and a plurality of heat dissipation capsules are dispersedly disposed in the protective layer. The heat dissipation capsules are provided with a phase change material. When the display device and the display terminal is at a high temperature condition, the phase change material can change the material state thereof and absorb a large amount of heat, thereby cooling the display device and the display terminal, solving the problem of difficult heat dissipation of the display device and the display terminal, and improving the image display quality.

BRIEF DESCRIPTION OF DRAWINGS

In order to more clearly illustrate technical solutions in embodiments of the present disclosure, a brief description of accompanying drawings used in a description of the embodiments will be given below. Obviously, the accompanying drawings in the following description are merely some embodiments of the present disclosure. For those skilled in the art, other drawings may be obtained from these accompanying drawings without creative labor.

DETAILED DESCRIPTION

Figure 1:
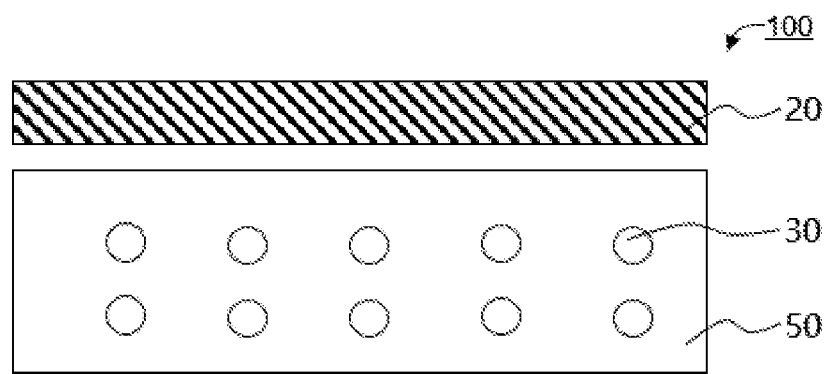
FIG. 1 is a schematic diagram of a first partial cross-section structure of a display device according to an embodiment of the present application.

The technical solutions in the embodiments of the present application will be clearly and completely described below in coboundary with the drawings in the embodiments of the present application. Obviously, the described embodiments are only a portion of the embodiments of the present application, rather than all the embodiments. Based on the embodiments in the present application, all other embodiments obtained by those skilled in the art without creative work shall fall within the protection scope of the present application. In the present application, unless otherwise stated, directional words used such as "upper" and "lower" generally refer to the upper and lower directions of the device in actual use or working state, and specifically refer to the drawing directions in the drawings, and "inner" and "outer" refer to outlines of the device.

Embodiments of the present application provide a display device, comprising a display panel; a protective layer disposed outside the display panel; and a plurality of heat dissipation capsules dispersedly disposed in the protective layer, wherein each of the plurality of the heat dissipation capsules comprises a shell and a phase change material disposed in the shell.

Embodiments of the present application provides a display device and a display terminal. Detailed descriptions are given below. It should be noted that the order of description in the following embodiments is not meant to limit the preferred order of the embodiments.

Embodiment 1

Figure 2:
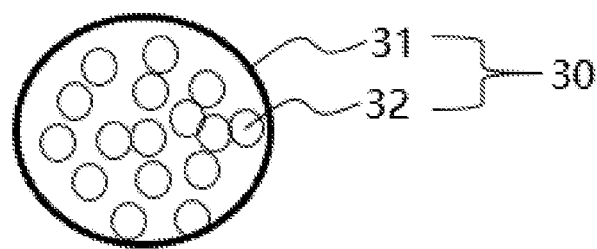
FIG. 2 is a schematic diagram of a heat dissipation capsule provided by an embodiment of the present application.

Please refer to FIG. 1 and FIG. 2, FIG. 1 is a schematic diagram of a first partial cross-section structure of a display device 100 according to an embodiment of the present application, and FIG. 2 is a schematic diagram of a heat dissipation capsule according to an embodiment of the application.

An embodiment of the present application provides a display device 100. The display device 100 comprises a display panel 20, a protective layer 50, and a plurality of heat dissipation capsules 30. The display device 100 comprises a display panel 20; a protective layer 50 disposed outside the display panel 20; and the plurality of heat dissipation capsules 30 dispersedly disposed in the protective layer 50, wherein each of the plurality of heat dissipation capsule 30 comprises a shell 31 and a phase change material 32 disposed in the shell 31.

Specifically, the display panel 20 may be a liquid crystal display panel, an organic light emitting display panel, or other types of display panels. When the display panel 20 is an organic light emitting display panel, the display panel 20 may comprise an array substrate, a light emitting layer, and an encapsulation layer.

Specifically, the protective layer 50 is disposed outside the display panel 20. The protective layer 50 can be used to protect the display panel 20 or the display device 100, the protective layer 50 can be also used to support the display panel 20 or the display device 100, and the protective layer 50 can also be provided to serve other functions for the display panel 20 or the display device 100. Herein, the protective layer is used to define its name, and some structures and functions of the protective layer 50 will be illustrated by examples in the following embodiments.

Specifically, the heat dissipation capsules 30 are dispersedly disposed in the protective layer 50 refers to the physical combination of the heat dissipation capsules 30 and the protective layer 50. The heat dissipation capsules 30 are dispersed and disposed in the protective layer 50 according to a predetermined density, so that the protective layer 50 can dissipate heat.

Specifically, each of the heat dissipation capsules 30 comprises a shell 31 and a phase change material 32 disposed in the shell 31. The phase-change material (PCM) refers to a substance that changes a state of a substance and can provide latent heat under a condition of constant temperature. A process of transforming physical properties is called a phase-change process, and at this time the phase change material will absorb or release a large amount of latent heat.

Specifically, each of the heat dissipation capsules 30 comprises a shell 31 and a phase change material 32 disposed in the shell 31. The shell 31 can be an organic substance, a metal, or an inorganic substance, and is not limited here, and the function of the shell 31 is to prevent the phase change material 32 from overflowing before and after a material state thereof is changed.

In the embodiment of the present application, the phase change material 32 in the heat dissipation capsule 30 is disposed outside the display panel 20, heat is transferred to the heat dissipation capsule 30 when the display panel 20 or the display device 100 is at a high temperature condition, the phase change material 32 in the heat dissipation capsule 30 can undergo a material state change and changes from a first state to a second state when a temperature of an environment where the phase change material 32 is located is greater than its phase change temperature, thereby absorbing heat and dissipating heat. The temperature of the display panel 20 or the display device 100 is thus controlled near the phase change temperature of the phase change material 32, so that the display panel 20 and the display device 100 can be cooled, which solves problems of difficult heat dissipation of the display panel 20 and the display device 100 and helps to improve image display qualities and user experiences. When the temperature of the display panel 20 and the display device 100 is reduced, for example, the display panel 20 and the display device 100 are turned off, the phase change material 32 in the heat dissipation capsule 30 undergoes a material state transition again and is changed from the second state to the first state. Thus, it is realized that the phase change material 32 can repeatedly absorb and release the heat of the display panel 20 and the display device 100 for heat dissipation and cooling.

In embodiments of the present application, the phase change material in the heat dissipation capsules in the protective layer undergoes a phase change to absorb heat when the display device such as a mobile phone or display terminal continuously works efficiently and generates heat to thereby reduce a highest temperature it will withstand, for example, a maximum temperature is 60° C. The phase change material absorbs a portion of the heat, so that the temperature is controlled near the phase change temperature, for example, the phase change temperature of a phase change material 32 is 40° C. As the display device such as a mobile phone or the display terminal is turned off, its own temperature drops to the phase change temperature, at this time the phase change material undergoes a phase change and releases the absorbed heat. This not only improves a heat resistance of the product, but also is helpful to the product's thermal shock, high temperature and high humidity operation and other capabilities.

Embodiment 2

Figure 3:
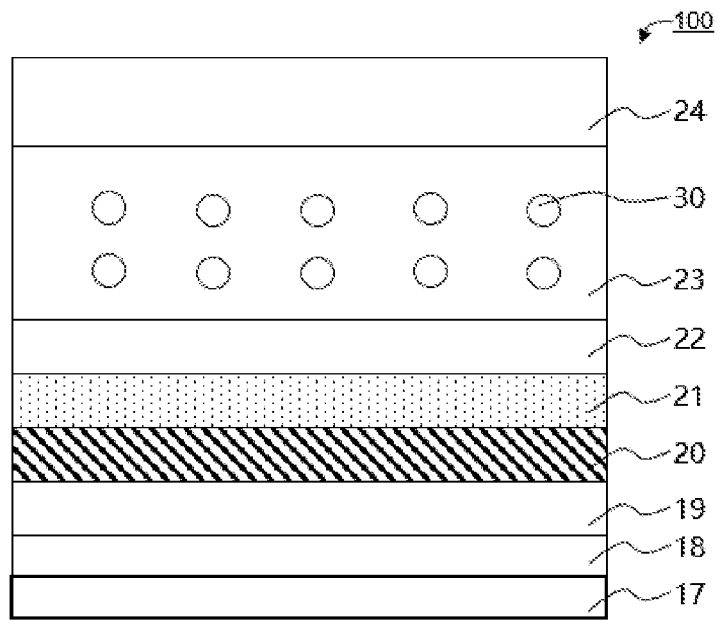
FIG. 3 is a schematic diagram of a second partial cross-section structure of a display device according to an embodiment of the present application.
Figure 4:
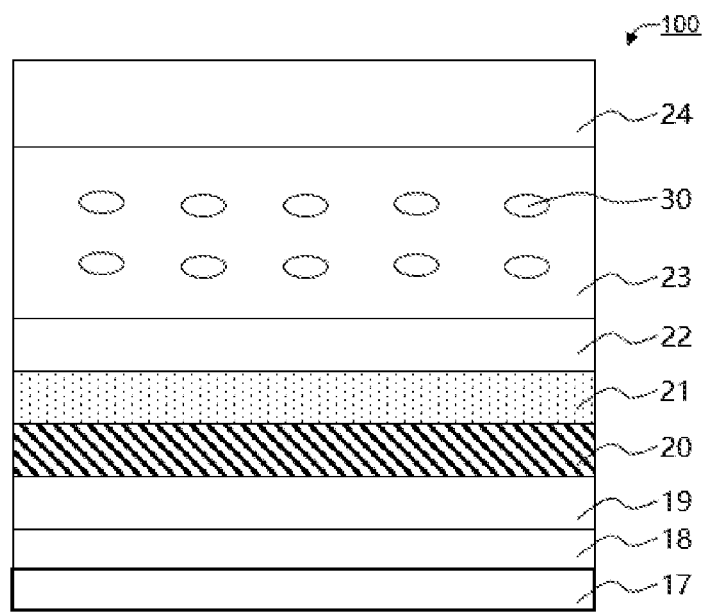
FIG. 4 is a schematic diagram of a third partial cross-sectional structure of a display device according to an embodiment of the present application.
Figure 5:
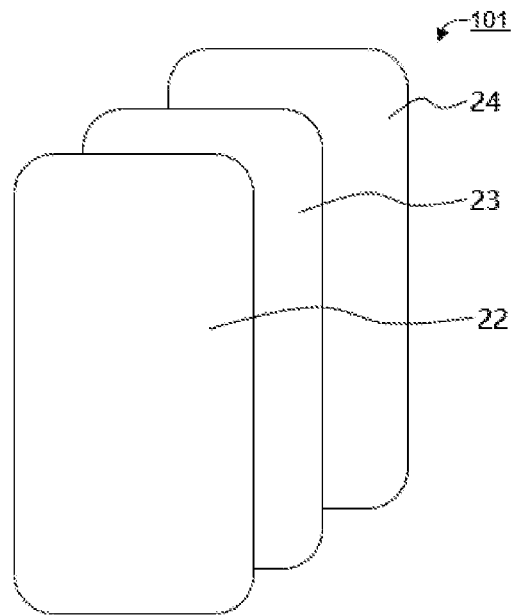
FIG. 5 is a schematic side view of an ultra-clean foam provided by an embodiment of the present application.
Figure 6:
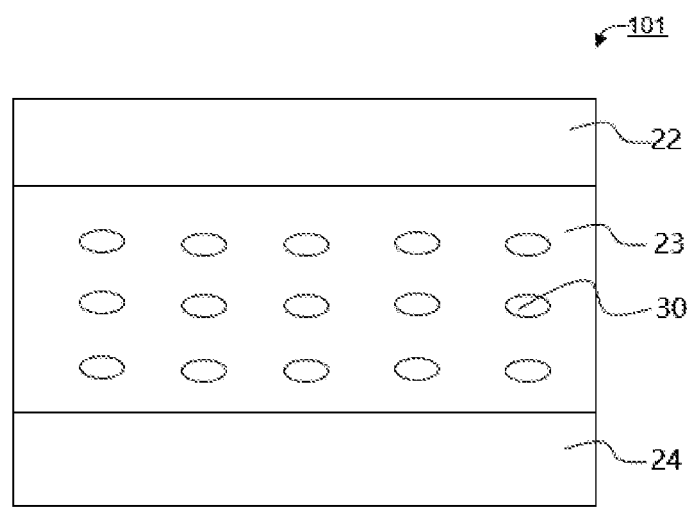
FIG. 6 is a schematic cross-sectional view of an ultra-clean foam provided by an embodiment of the present application.

Please refer to FIG. 3, FIG. 4, FIG. 5, and FIG. 6, FIG. 3 is a schematic diagram of a second partial cross-sectional structure of a display device 100 provided by an embodiment of the application, FIG. 4 is a display device provided by an embodiment of the application, FIG. 5 is a schematic side view of an ultra-clean foam provided by an embodiment of the present application, and FIG. 6 is a schematic cross-sectional view of an ultra-clean foam provided by an embodiment of the present application.

In some embodiments, in the display device 100, the display device 100 further comprises a thermal conductive layer 24, and the protective layer 50 comprises a first protective layer 23. The first protective layer 23 is provided between the display panel and the thermal conductive layer 24, and the heat dissipation capsules 30 are dispersedly disposed in the first protective layer 23.

In some embodiments, the first protective layer comprises foam.

Specifically, the protective layer 50 comprises the first protective layer 23, a material of the first protective layer 23 may be foam, and the first protective layer 23 provides buffering performances for the display device 100.

Specifically, the material of the thermal conductive layer 24 is a thermally conductive material, for example, it may comprise at least one of copper, aluminum, iron, and stainless steel to provide heat dissipation for the display device 100.

Specifically, the first protective layer 23 comprises foam, and the first protective layer 23, a mesh glue 22, and the thermally conductive layer 24 constitute an ultra-clean foam 101. The first protective layer 23 is disposed between the mesh glue 22 and the thermal conductive layer 24. The thermal conductive layer 24 can be copper foil or stainless steel (SUS). The ultra-clean foam 101 is disposed on a back side of the display panel 20, and it is able to provide supporting, buffering, heat dissipation, and anti-static effects for the display panel 20.

Specifically, the display device 100 may also comprises other structures. A laminated structure of the display device 100 may sequentially comprises: a protective cover 17 (as a, cover glass, CG), an optical glue 18 (OCA, OCR, etc.), a polarizer 19, a display panel 20, a back plate layer 21 (BP), a mesh glue 22 (embo), a first protective layer 23, and a thermal conductive layer 24. It should be noted that the number of layer structure of the display device 100, the stacking sequence of the laminated structure, materials of the layers in the structure is not limited thereto.

In some embodiments, the display device comprises a back plate layer 21 and a thermal conductive layer 24. The first protective layer 23 is disposed between the back plate layer 21 and the thermal conductive layer 24. The thermal conductive layer 24 is disposed on a back side of the first protective layer.

Specifically, the back plate layer 21 may be an organic material such as polyimide (PI) and polyethylene terephthalate (PET, commonly known as polyester resin). The thermal conductive layer 24 may be a thermal conductive material such as copper foil or stainless steel (SUS). The back plate layer 21 and the thermal conductive layer 24 are respectively disposed on both sides of the first protective layer 23 to prevent the heat dissipation capsules 30 from falling or overflowing from the first protective layer 23.

In embodiments of the present application, the protective layer 50 comprises a first protective layer 23, for example, the first protective layer comprises foam. The first protective layer 23 is provided on the back side of the display panel 20, and the heat dissipation capsules 30 are dispersedly disposed in the first protective layer 23. The first protective layer 23 not only provides buffering performances for the display panel 20 the display device 100, but also provide good heat dissipation.

In this embodiment of the present application, the heat dissipation capsules 30 are disposed in the first protective layer 23 of the display device. When the display panel 20 or the display device 100 is at a high temperature condition, the phase change material 32 in the heat dissipation capsule 30 can undergo a material state change and changes from a first state to a second state, thereby absorbing heat and dissipating heat, which solves problems of difficult heat dissipation of the display panel 20 and the display device 100 and helps to improve image display qualities and user experiences. When the temperature of the display panel 20 and the display device 100 is reduced, for example, the display panel 20 and the display device 100 are turned off, the phase change material 32 in the heat dissipation capsule 30 undergoes a material state transition again and is changed from the second state to the first state. Thus, it is realized that the phase change material 32 can repeatedly absorb and release the heat of the display panel 20 and the display device 100 for heat dissipation and cooling.

Specifically, the state of the phase change material 32 comprises solid, liquid and gaseous states. The first state can be a solid state, and the second state can be a liquid state or a molten state. The phase change material absorbs a lot of heat when it transforms from the first state to the second state. The heat dissipation capsule 30 in FIG. 3 is illustrated as a circular shape that shows the phase change material 32 is in the first state. The phase change material releases heat when it transforms from the second state to the first state. In FIG. 4, the heat dissipation capsule 30 in illustrated as an oval shape that shows the phase change material 32 is in the second state.

Embodiment 3

This embodiment of the present application is the same as or similar to the above-mentioned embodiments, and the difference is that a location of the heat dissipation capsule 30 is different, and the structure of the display device 100 is further described as an example.

Figure 7:
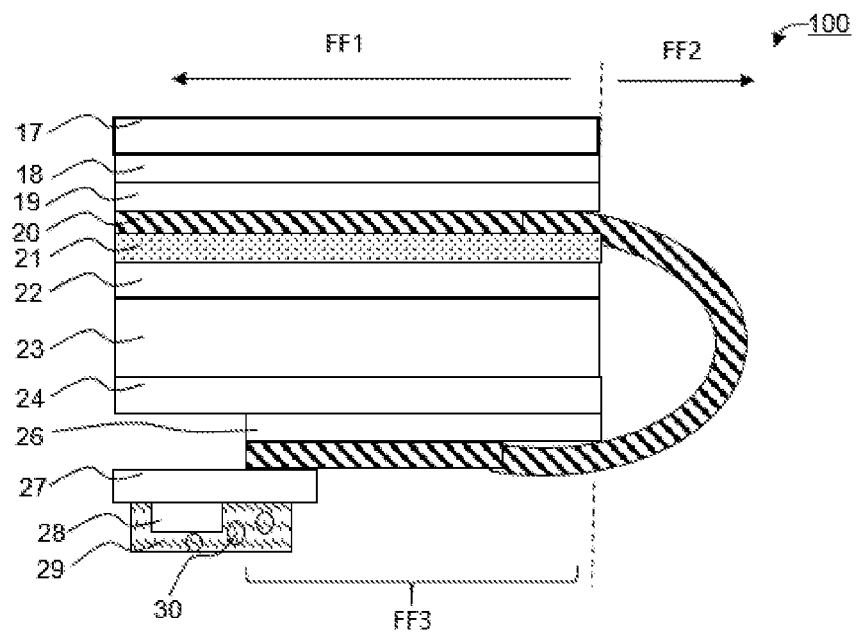
FIG. 7 is a schematic diagram of a fourth partial cross-sectional structure of a display device according to an embodiment of the present application.

Please refer to FIG. 7. FIG. 7 is a schematic diagram of a fourth partial cross-sectional structure of a display device 100 according to an embodiment of the present application.

In some embodiments, the display device 100 further comprises a circuit board 27 and a driving chip 28 electrically connected to the display panel 20. The protective layer 50 comprises a second protective layer 29, and the heat dissipation capsules 30 are dispersedly disposed in the second protective layer 29. The protective layer 29 is adhered to the circuit board 27 or/and the driving chip 28.

In some embodiments, the second protective layer 29 is an insulating tape.

Specifically, FIG. 7 shows that the display device 100 further comprises a circuit board 27 electrically connected to the display panel 20 and a driving chip 28. The circuit board 27 may be a flexible circuit board (COF), and the driving chip 28 may be a driving IC. As shown in FIG. 7, the display panel 20 is electrically connected to the circuit board 27, and the driving chip 28 is disposed on the circuit board 27. The driving chip 28 and the circuit board 27 can also have other arrangements. For example, the driving chip 28 is directly disposed on the array substrate of the display panel 20, and is not limited thereto.

In this embodiment of the present application, the heat dissipation capsules 30 are disposed in the second protective layer. When the circuit board 27 and/or the driving chip 28 is at a high temperature condition, the phase change material 32 in the heat dissipation capsule 30 can undergo a material state change and changes from a first state to a second state, thereby absorbing heat and dissipating heat, which solves problems of difficult heat dissipation of the circuit board 27 and/or the driving chip 28 and helps to improve image display qualities and user experiences. When the temperature of the circuit board 27 and/or the driving chip 28 is reduced, for example, the display panel 20 and the display device 100 are turned off, the phase change material 32 in the heat dissipation capsule 30 undergoes a material state transition again and is changed from the second state to the first state. Thus, it is realized that the phase change material 32 can repeatedly absorb and release the heat of the circuit board 27 and/or the driving chip 28 for heat dissipation and cooling.

Embodiment 4

This embodiment of the present application is the same as or similar to the above-mentioned embodiments, and the difference is that the location of the heat dissipation capsules 30 is different, and the structure of the display device 100 is further described as an example.

Figure 8:
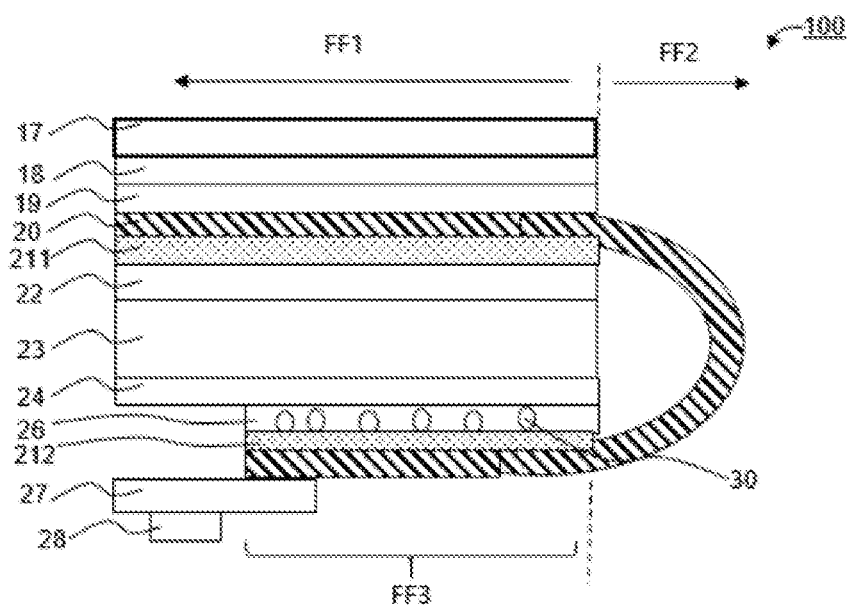
FIG. 8 is a schematic view of a fifth partial cross-sectional structure of a display device according to an embodiment of the present application.

Please refer to FIG. 8. FIG. 8 is a schematic diagram of a fifth partial cross-sectional structure of a display device 100 according to an embodiment of the present application.

In some embodiments, in the display device 100, the protective layer 50 comprises a third protective layer 26 (stiffener), and the display panel 20 comprises a non-foldable portion a foldable portion FF2, and a pad portion FF3. The foldable portion FF2 is provided between the non-foldable portion FF1 and the pad portion FF3. After the foldable portion FF2 is folded, the pad portion FF3 is fixed to a back side of the non-foldable portion FF1 through the third protective layer 26, and the heat dissipation capsules 30 are dispersedly disposed in the third protective layer 26.

In some embodiments, the third protective layer 26 is a double-sided tape. Specifically, the third protective layer 26 is disposed between the thermal conductive layer 24 and the pad portion FF3 of the display panel 20. For example, a double-sided adhesive tape fixes (adheres) the pad portion FF3 on the thermal conductive layer 24.

More specifically, the back plate layer 21 comprises a first section back plate layer 211 provided on the non-foldable portion FF1 and a second section back plate layer 212 provided on the pad portion FF3. The first section back plate layer 211 and the second section back plate layer 212 are placed on the same side of the display panel 20, and the double-sided tape is placed between the thermal conductive layer 24 and the second back plate layer 212. The function of the double-sided tape is to fix the thermal conductive layer 24 and the second backplane layer 212, so that the pad portion FF3 is fixed (or adhered) on the thermal conductive layer 24.

Specifically, the pad portion FF3 can be used to electrically connect the circuit board 26 and the driving chip 28.

The back side of the non-foldable portion FF1 refers to a side opposite to the side where the image is displayed, that is, the side where the back plate layer 21 is provided.

In this embodiment of the present application, the heat dissipation capsules 30 are disposed in the third protective layer 26, and the pad portion FF3 is fixed to the back side of the non-foldable portion FF1 through the third protective layer 26. When the pad portion FF3 is at a high temperature condition, the phase change material 32 in the heat dissipation capsule 30 can undergo a material state change and changes from a first state to a second state, thereby absorbing heat and dissipating heat, which solves problems of difficult heat dissipation of the pad portion FF3 and helps to improve image display qualities and user experiences. When the temperature of the pad portion FF3 is reduced, for example, the display panel 20 and the display device 100 are turned off, the phase change material 32 in the heat dissipation capsule 30 undergoes a material state transition again and is changed from the second state to the first state. Thus, it is realized that the phase change material 32 can repeatedly absorb and release the heat of the pad portion FF3 for heat dissipation and cooling.

Embodiment 5

This embodiment of the present application is the same as or similar to the above-mentioned embodiments, except that the protective layer 50 comprises a first protective layer 23, a second protective layer 29, and a third protective layer 26 at the same time.

Please refer to the illustration in the above embodiments, the protective layer 50 comprises a first protective layer 23, a second protective layer 29, and a third protective layer 26 at the same time.

In the display device 100, the first protective layer 23 comprises the dispersedly disposed heat dissipation capsules 30, that is, the heat dissipation capsules 30 are dispersedly disposed in the first protective layer 23. The display device 100 further comprises a thermal conductive layer 24, and the protective layer 50 comprises a first protective layer. 23. The first protective layer 23 is disposed between the display panel and the heat conductive layer 24.

In the display device 100, the second protective layer 29 comprises the dispersedly disposed heat dissipation capsules 30, that is, the heat dissipation capsules 30 are simultaneously dispersed within the second protective layer 29. The display device 100 also comprises a circuit board 27 and a driving chip 28 electrically connected to the display panel 20. The driving chip 28 and the second protective layer 29 are adhered to the circuit board 27 or/and the driving chip 28.

In the display device 100, the third protective layer 26 comprises the dispersedly disposed heat dissipation capsules 30, that is, the heat dissipation capsules 30 are also dispersed within the third protective layer 26 at the same time. The display panel 20 comprises a non-foldable portion FF1, a foldable portion FF2, and a pad portion FF3. The foldable portion FF2 is disposed between the non-foldable portion FF1 and the pad portion 1-1-3. After the foldable portion FF2 is folded, the land portion FF3 is fixed to the back side of the non-foldable portion 1-1-1 through the third protective layer 26.

Specifically, in this embodiment of the present application, the protective layer 50 comprises a first protective layer 23, a second protective layer 29, and a third protective layer 26 at the same time. At the same time, the heat dissipation capsules 30 are simultaneously disposed in the first protective layer 23, the second protective layer 29, and the third protective layer 26.

Furthermore, the first protective layer 23 is foam, the second protective layer 29 is an insulating tape, and the third protective layer 26 is a double-sided tape.

Specifically, the first protective layer 23 plays a role of buffering and heat dissipation. In order to satisfy the sufficient buffering performance of the first protective layer 23, it is necessary to reduce a density of the heat dissipation capsules 30 in the first protective layer 23 to a predetermined value. In addition, the second protective layer 29 and the third protective layer 26 are closer to the circuit board 27 or/and the driver chip 28, and even the second protective layer 29 is directly disposed on the circuit board 27 or/and the driver chip 28. The circuit board 27 or/and the driving chip 28 is the easiest to generate heat, and it is most necessary to reduce its temperature and dissipate its heat. It is necessary to increase the density of the heat dissipation capsules 30 in the second protective layer 29 and the third protective layer 26, especially to increase the density of the heat dissipation capsules 30 in the second protective layer 29. Based on the performance requirements and heat dissipation requirements of each component, the density of the heat dissipation capsules 30 in the second protective layer 29 can be set to be greater than or equal to the density of the heat dissipation capsules 30 in the third protective layer 26. At the same time, the density of the heat dissipation capsules 30 in the third protective layer 26 is greater than the density of the heat dissipation capsules 30 in the first protective layer 23.

In this embodiment of the present application, in the display device 100, a first protective layer 23, a second protective layer 29 and a third protective layer 26 are simultaneously provided, and the first protective layer 23, the second protective layer 29 and the third protective layer 26 are provided with the heat dissipation capsules 30 therein, which can quickly dissipate heat and cool down the various components of the display device 100, thereby improving the heat dissipation effect.

Embodiment 6

This embodiment is based on the above-mentioned embodiment and further illustrates the phase change material.

Please refer to Table 1 and Table 2. Table 1 shows examples of an inorganic phase change material provided in an embodiment of the application, and Table 2 shows examples of an organic phase change material provided in an embodiment of the application.

In some embodiments, the phase change material 32 comprises an inorganic phase change material.

Specifically, the inorganic phase change material means that the phase change material is an inorganic material.

In some embodiments, the inorganic phase change material comprises at least one of zinc nitrate ($Zn(NO_3)_2 \cdot 6H_2O$), sodium thiosulfate ($Na_2S_2O_3 \cdot 5H_2O$), disodium hydrogen phosphate dodecahydrate ($Na_2HPO_4 \cdot 12H_2O$), hexahydrate chlorination calcium ($CaCl_2 \cdot 6H_2O$) and sodium sulfate ($Na_2SO_4 \cdot 10H_2O$).

Specifically, the following table 1 lists physical properties of some inorganic phase change materials, wherein the inorganic phase change materials such as zinc nitrate ($Zn(NO_3)_2 \cdot 6H_2O$), sodium thiosulfate ($Na_2S_2O_3 \cdot 5H_2O$), disodium hydrogen phosphate dodecahydrate ($Na_2HPO_4 \cdot 12H_2O$), calcium chloride hexahydrate ($CaCl_2 \cdot 6H_2O$), sodium sulfate ($Na_2SO_4 \cdot 10H_2O$) have a low melting point or phase transition temperature, with a melting point between 30° C. and 50° C., and a large specific heat capacity. When a material state changes, it absorbs or releases a large amount of heat, which can be well applied to the heat dissipation capsule for heat dissipation.

TABLE 1

| Hydrated salt | Melting point (° C.) | Heat for melting (J · g$^{-1}$) | Density (Kg/dm$^2$) | Specific Heat Capacity (KJ · Kg$^{-1}$ · K$^{-1}$) | |
| --- | --- | --- | --- | --- | --- |
| | | | | Solid | Liquid |
| $Zn(NO_3)_2 \cdot 6H_2O$ | 36.1 | 146.95 | 1954 | 1.34 | 2.26 |
| $Na_2S_2O_3 \cdot 5H_2O$ | 48.5 | 208.8 | 1666 | 1.46 | 2.38 |
| $Na_2HPO_4 \cdot 12H_2O$ | 35 | 278.84 | 1522 | 1.55 | 2.51 |
| $CaCl_2 \cdot 6H_2O$ | 29.7 | 169.98 | 1560 | 1.46 | 1.13 |
| $Na_2SO_4 \cdot 10H_2O$ | 32.4 | 254 | 1458 | 1.76 | 3.31 |

In some embodiments, the phase change material 32 comprises an organic phase change material.

Specifically, the organic phase change material means that the phase change material is an organic material.

In some embodiments, the organic phase change material comprises at least one of paraffin-based, higher fatty acid, polyolefin, and alcohol-based organic materials.

In some embodiments, the organic phase change material comprises at least one of stearic acid, palmitic acid, myristic acid, slice paraffin, lauric acid, and acetamide.

Specifically, the following table 2 lists the physical properties of some organic phase change materials, wherein organic phase change materials such as stearic acid, palmitic acid, myristic acid, slicing paraffin, lauric acid, acetamide have a lower melting point or phase transition temperature. The melting point is between 40° C. and 80° C. has a large specific heat capacity. When the state of the substance changes, it absorbs or releases a large amount of heat, which can be well applied to the heat dissipation capsules for heat dissipation.

TABLE 2

| Organic compound | Phase transition temperature (° C.) | Latent heat of phase transition (KJ · Kg − 1) | Density (Kg/dm$^2$) | | Specific Heat Capacity (KJ · Kg$^{-1}$ · K$^{-1}$) | |
| --- | --- | --- | --- | --- | --- | --- |
| | | | Solid | Liquid | Solid | Liquid |
| stearic acid | 54~56 | 186.5 | 1080 | 1150 | 2.83 | 2.38 |
| palmitic acid | 61 | 203.4 | 942 | 862 | 2.2 | 2.48 |
| myristic acid | 51.5 | 204.5 | / | / | 2.8 | 2.42 |
| slice paraffin | 56~58 | 146 | / | / | / | / |
| lauric acid | 41~43 | 211.6 | 1007 | 862 | 1.76 | 2.27 |
| acetamide | 81 | 241 | / | / | / | / |

In some embodiments, the heat dissipation capsules 30 further comprises a heat transfer material disposed in the shell 31.

In some embodiments, the heat transfer material comprises at least one of aluminum, copper, or graphite.

Specifically, in some embodiments, although the phase change material absorbs or releases a large amount of heat when the material state changes, it may have difficulties or slower heat transfer/conductivity, thus reducing the heat dissipation speed and heat dissipation effect. Therefore, the heat dissipation capsules 30 may also comprise a heat transfer material disposed in the shell 31, such as heat transfer materials such as aluminum, copper, or graphite, which can increase a speed of heat transfer from the display panel 20 or the display device 100 to the phase change material 32. Thereby, the heat dissipation effect and the heat dissipation speed can be improved.

In the embodiments of the present application, some inorganic phase change materials and organic phase change materials are illustrated as examples, which can be well applied to the heat dissipation capsules 30, so as to improve the heat dissipation effect and the heat dissipation speed.

Embodiment 7

Figure 9:
FIG. 9 is a schematic diagram of a display terminal provided by an embodiment of the present application.

Please refer to FIG. 9, which is a schematic diagram of a display terminal 1000 according to an embodiment of the application.

An embodiment of the present application also provides a display terminal 1000, which comprises a terminal body 200 and the display device 100 of any one of the foregoing embodiments, and the terminal body 200 and the display device 100 are combined into one body.

Specifically, the display terminal 1000 may be a mobile phone, and the display terminal 1000 comprises structures such as the display device 100 of any one of the foregoing embodiments and a middle frame.

The above is a detailed introduction to a display device and a display terminal provided by the embodiments of the present invention, and specific examples are used in this article to illustrate the principles and implementations of the present invention. Specific examples are used in this article to illustrate the principles and implementation of the present application. Its core idea, at the same time, for those skilled in the art, according to the idea of the present application, there will be changes in the specific implementation and scope of application. In summary, the content of the present specification should not be construed as a limitation to the present application.

What is claimed is:

1. A display device, comprising:
 a display panel;
 a protective layer disposed outside the display panel;

a plurality of heat dissipation capsules dispersedly disposed in the protective layer, wherein each of the plurality of heat dissipation capsules comprises a shell and a phase change material disposed in the shell;

a thermal conductive layer; and a circuit board and a driving chip electrically connected to the display panel;

wherein the protective layer comprises a first protective layer and a second protective layer, the first protective layer is disposed between the display panel and the thermal conductive layer, the plurality of heat dissipation capsules are dispersedly disposed in the first protective layer and the second protective layer, and the second protective layer is adhered to the circuit board or/and the driving chip.

2. The display device of claim 1, wherein the first protective layer comprises foam.

3. The display device of claim 1, wherein the second protective layer is an insulating tape.

4. The display device of claim 1, wherein the protective layer comprises a third protective layer, the display panel comprises a non-foldable portion, a foldable portion, and a pad portion, and the foldable portion is disposed between the non-foldable portion and the pad portion, after the foldable portion is folded, the pad portion is fixed to a back side of the non-foldable portion through the third protective layer, and the plurality of heat dissipation capsules are dispersedly disposed in the third protective layer.

5. The display device of claim 4, wherein the third protective layer is a double-sided tape.

6. The display device of claim 1, wherein
the first protective layer comprises the plurality of heat dissipation capsules dispersedly disposed,
the second protective layer comprises the plurality of the heat dissipation capsules dispersedly disposed; and
the protective layer further comprises: a third protective layer comprises the plurality of the heat dissipation capsules dispersedly disposed, the display panel comprises a non-foldable portion, a foldable portion, and a pad portion, and the foldable portion is disposed between the non-foldable portion and the pad portion, and the pad portion is fixed to a back side of the non-foldable portion through the third protective layer after the foldable portion is folded.

7. The display device of claim 6, wherein the first protective layer comprises foam, the second protective layer is an insulating tape, and the third protective layer is a double-sided tape.

8. The display device of claim 1, wherein the phase change material comprises an inorganic phase change material.

9. The display device of claim 8, wherein the inorganic phase change material comprises at least one of zinc nitrate, sodium thiosulfate, disodium hydrogen phosphate dodecahydrate, calcium chloride hexahydrate, and sodium sulfate.

10. The display device of claim 1, wherein the phase change material comprises an organic phase change material.

11. The display device of claim 10, wherein the organic phase change material comprises at least one of paraffins, higher fatty acids, polyolefins, and alcohol organic materials.

12. The display device of claim 11, wherein the organic phase change material comprises at least one of stearic acid, palmitic acid, myristic acid, slicing paraffin, lauric acid, and acetamide.

13. The display device of claim 1, wherein the plurality of heat dissipation capsules further comprise a heat transfer material provided in the shell.

14. The display device of claim 13, wherein the heat transfer material comprises at least one of aluminum, copper, or graphite.

15. A display terminal, including a terminal body and a display device, wherein the terminal body and the display device are integrated as one body, and the display device comprises:

a display panel;

a protective layer disposed outside the display panel;

a plurality of heat dissipation capsules dispersedly disposed in the protective layer, wherein each of the plurality of heat dissipation capsules comprises a shell and a phase change material disposed in the shell;

a thermal conductive layer; and a circuit board and a driving chip electrically connected to the display panel;

wherein the protective layer comprises a first protective layer and a second protective layer, the first protective layer is disposed between the display panel and the thermal conductive layer, the plurality of heat dissipation capsules are dispersedly disposed in the first protective layer and the second protective layer, and the second protective layer is adhered to the circuit board or/and the driving chip.

16. The display terminal of claim 15, wherein the protective layer comprises a third protective layer, the display panel includes a non-foldable portion, a foldable portion, and a pad portion, and the foldable portion is disposed between the non-foldable portion and the pad portion, after the foldable portion is folded, the pad portion is fixed to a back side of the non-foldable portion through the third protective layer, and the plurality of heat dissipation capsules are dispersedly disposed in the third protective layer.

17. A display device, comprising:

a display panel;

a protective layer disposed outside the display panel;

a plurality of heat dissipation capsules dispersedly disposed in the protective layer, wherein each of the plurality of heat dissipation capsules comprises a shell and a phase change material disposed in the shell;

wherein the protective layer comprises:

a first protective layer comprises the plurality of heat dissipation capsules dispersedly disposed, the display device further comprises a thermal conductive layer, and the first protective layer is disposed between the display panel and the thermal conductive layer;

a second protective layer comprises the plurality of the heat dissipation capsules dispersedly disposed, the display device further comprises a circuit board and a driving chip electrically connected to the display panel, and the second protective layer is adhered to the circuit board or/and the driving chip; and a third protective layer comprises the plurality of the heat dissipation capsules dispersedly disposed, the display panel comprises a non-foldable portion, a foldable portion, and a pad portion, and the foldable portion is disposed between the non-foldable portion and the pad portion, and the pad portion is fixed to a back side of the non-foldable portion through a third protective layer after the foldable portion is folded.

* * * * *